United States Patent
Chang et al.

(10) Patent No.: US 11,322,603 B2
(45) Date of Patent: May 3, 2022

(54) ANTI-PUNCH-THROUGH DOPING ON SOURCE/DRAIN REGION

(71) Applicant: TAIWAN SEMICONDUCTOR MANUFACTURING CO., LTD., Hsinchu (TW)

(72) Inventors: Hsiao-Chun Chang, Hsinchu County (TW); Guan-Jie Shen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 23 days.

(21) Appl. No.: 16/874,556

(22) Filed: May 14, 2020

(65) Prior Publication Data
US 2021/0226035 A1    Jul. 22, 2021

Related U.S. Application Data

(60) Provisional application No. 62/963,943, filed on Jan. 21, 2020.

(51) Int. Cl.
*H01L 29/66* (2006.01)
*H01L 21/265* (2006.01)
(Continued)

(52) U.S. Cl.
CPC ........ *H01L 29/6681* (2013.01); *H01L 21/265* (2013.01); *H01L 21/76224* (2013.01);
(Continued)

(58) Field of Classification Search
CPC ..... H01L 21/823487; H01L 21/823885; H01L 29/66545; H01L 29/66606; H01L 29/66871; H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; H01L 29/36–365; H01L 21/823493;
(Continued)

(56) References Cited

U.S. PATENT DOCUMENTS 8,962,400 B2    2/2015  Tsai et al.
9,093,514 B2    7/2015  Tsai et al.
(Continued)

*Primary Examiner* — Sonya McCall-Shepard
(74) *Attorney, Agent, or Firm* — Maschoff Brennan

(57) ABSTRACT

A method of forming a semiconductor device includes following steps. A semiconductor strip is formed extending above a semiconductor substrate. A shallow trench isolation (STI) region is formed over the semiconductor substrate. The semiconductor strip has a fin structure higher than a top surface of the STI region. The fin structure includes a channel portion and a source/drain (S/D) portion adjacent to the channel portion. A dummy gate stack is formed over the channel portion. The S/D portion is exposed by the dummy gate stack. A doping process is performed to a top of the S/D portion using first dopants. An epitaxy layer is formed around the top of the S/D portion. The epitaxy layer has second dopants. A conductivity type of the second dopants is different from a conductivity type of the first dopants. The dummy gate stack is replaced with a replacement gate stack.

20 Claims, 13 Drawing Sheets

(51) Int. Cl.
*H01L 21/762* (2006.01)
*H01L 21/8234* (2006.01)
*H01L 29/06* (2006.01)
*H01L 29/78* (2006.01)
*H01L 21/28* (2006.01)

(52) U.S. Cl.
CPC .. *H01L 21/823431* (2013.01); *H01L 29/0653* (2013.01); *H01L 29/785* (2013.01)

(58) Field of Classification Search
CPC ..... H01L 21/823412; H01L 21/823807; H01L 29/1041–105; H01L 29/1054; H01L 29/66537; H01L 29/1083; H01L 29/7842–7849; H01L 29/0843–0891; H01L 29/66636–66643; H01L 21/823418–823425; H01L 21/823814; H01L 29/41783; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 21/02293; H01L 21/02631; H01L 21/02634; H01L 21/2018; H01L 21/2022–2026; H01L 21/2033–2036; H01L 21/2085; H01L 21/2855; H01L 21/3147; H01L 21/76248; H01L 21/76262; H01L 21/76278; H01L 21/76294; H01L 21/76297; C23C 14/48
See application file for complete search history.

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,799,777 | B1* | 10/2017 | Balakrishnan ............... H01L 21/823487 |
| 9,812,363 | B1 | 11/2017 | Liao et al. |
| 9,859,380 | B2 | 1/2018 | Lee et al. |
| 10,262,904 | B2* | 4/2019 | Gluschenkov ...... H01L 29/7827 |
| 2020/0111714 | A1* | 4/2020 | Lee .................. H01L 21/02236 |
| 2020/0357898 | A1* | 11/2020 | Lee ..................... H01L 27/088 |

* cited by examiner

ANTI-PUNCH-THROUGH DOPING ON SOURCE/DRAIN REGION

CROSS-REFERENCE TO RELATED APPLICATION

This application claims priority to U.S. Provisional Application Ser. No. 62/963,943, filed Jan. 21, 2020, which is herein incorporated by reference in its entirety.

BACKGROUND

With the sizes of an integrated circuits becoming increasing smaller, the respective formation processes also become increasingly more difficult, and problems may occur where conventionally no problems have occurred. For example, in the formation of Fin Field-Effect Transistors (FinFETs), the sizes of the source/drain contact plugs become smaller, making contact resistance increasingly higher.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
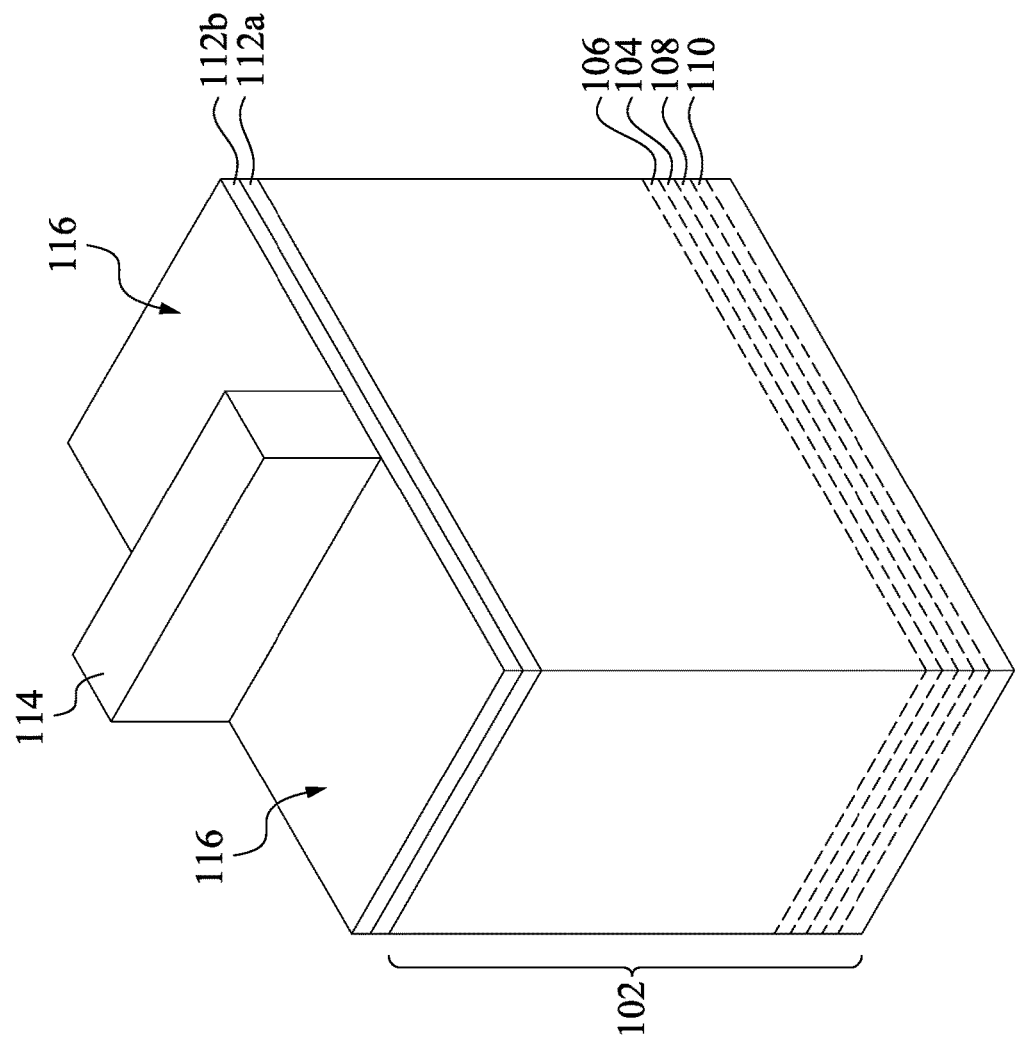
FIGS. 1-11 and 12A are perspective views of the intermediate stages in the formation of a transistor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Referring to FIGS. 1-11 and 12A, illustrated are perspective views of the semiconductor device 100 at various stages of fabrication according to various embodiments of the present disclosure. FIG. 12B illustrates a cross-sectional view of the semiconductor device 100 taken along a line a-a of FIG. 12A.

FIG. 1 is a perspective view of the semiconductor device 100 having a substrate 102 at one of various stages of fabrication according to an embodiment. In one embodiment, the substrate 102 includes a crystalline silicon substrate (e.g., wafer). In some alternative embodiments, the substrate 102 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 102 may include an epitaxial layer (epi-layer), may be strained for performance enhancement, and/or may include a silicon-on-insulator (SOI) structure.

In some embodiments, the substrate 102 includes various doped regions. The substrate 102 may include a well region 104 depending on design requirements (e.g., p-type substrate or n-type substrate). In some embodiments, the well region 104 may be doped with p-type or n-type dopants. For example, the well region 104 may be doped with p-type dopants, such as boron or $BF_2$; n-type dopants, such as phosphorus or arsenic; and/or combinations thereof. The well region 104 may be configured for an n-type FinFET, or alternatively configured for a p-type FinFET. For an n-type filed effect (NFET) transistor, the well region 104 should be doped with p-type dopants to form PN junctions. For a p-type filed effect (PFET) transistor, the well region 104 should be doped with n-type dopants.

An anti-punch through (APT) region 106 is formed in the substrate 102. The APT region 106 is configured to reduce source-to-drain leakage and Drain-Induced Barrier Lowering (DIBL). The DIBL is a short-channel effect in metal oxide semiconductor field-effect transistors (MOSFETs), referring to a reduction of threshold voltage of the transistor at higher drain voltages. The APT region 106 may be an n-type APT region or a p-type APT region. In some embodiments, the n-type APT region is obtained by doping with an n-type dopant, such as arsenic (As), phosphorous (P), or antimony (Sb). In some embodiments, the p-type APT region is obtained by doping with a p-type dopant, such as boron (B) or boron fluoride ($BF_2$). In some embodiments, an ion implantation (IMP) process is performed to form the APT region 106. After the APT region 106 is formed, a thermal process is performed to activate the dopant in the APT region 106. In some embodiments, the thermal processing is performed by a rapid thermal annealing process.

In some embodiments, the substrate 102 is subjected to a blanket boron filed implantation to form a blanket boron implant region 108. The blanket boron implant region 108 is below the APT region 106. In some embodiments, an additional well implant including dopants may be performed to form a deep well implant region 110 underlying the blanket boron implant region 108. The deep well implant region 110 provides a reduced serial capacitance. For an n-type filed effect (NFET) transistor, the deep well implant region 110 is doped with p-type dopants to form PN junctions. For a p-type FET (or PFET), the deep well implant region 110 is doped with n-type dopants. It is appreciated that the dimensions recited throughout the description are merely examples, and may be changed to different values. The conductivity type of well region 104 is the same as the conductivity type of deep well region 110.

In one embodiment, a pad layer 112a and a mask layer 112b are formed on the substrate 102. The pad layer 112a may be a thin film including silicon oxide formed, for example, using a thermal oxidation process. The pad layer 112a may act as an adhesion layer between the substrate 102 and the mask layer 112b. The pad layer 112a may also act as an etch stop layer for etching the mask layer 112b. In at least one embodiment, the mask layer 112b is formed of silicon nitride, for example, using low-pressure chemical vapor deposition (LPCVD) or plasma enhanced chemical vapor deposition (PECVD). The mask layer 112b is used as a hard mask during subsequent photolithography processes. A photo-sensitive layer 114 is formed on the mask layer 112b and is then patterned, forming openings 116 in the photo-sensitive layer 114.

Figure 2:
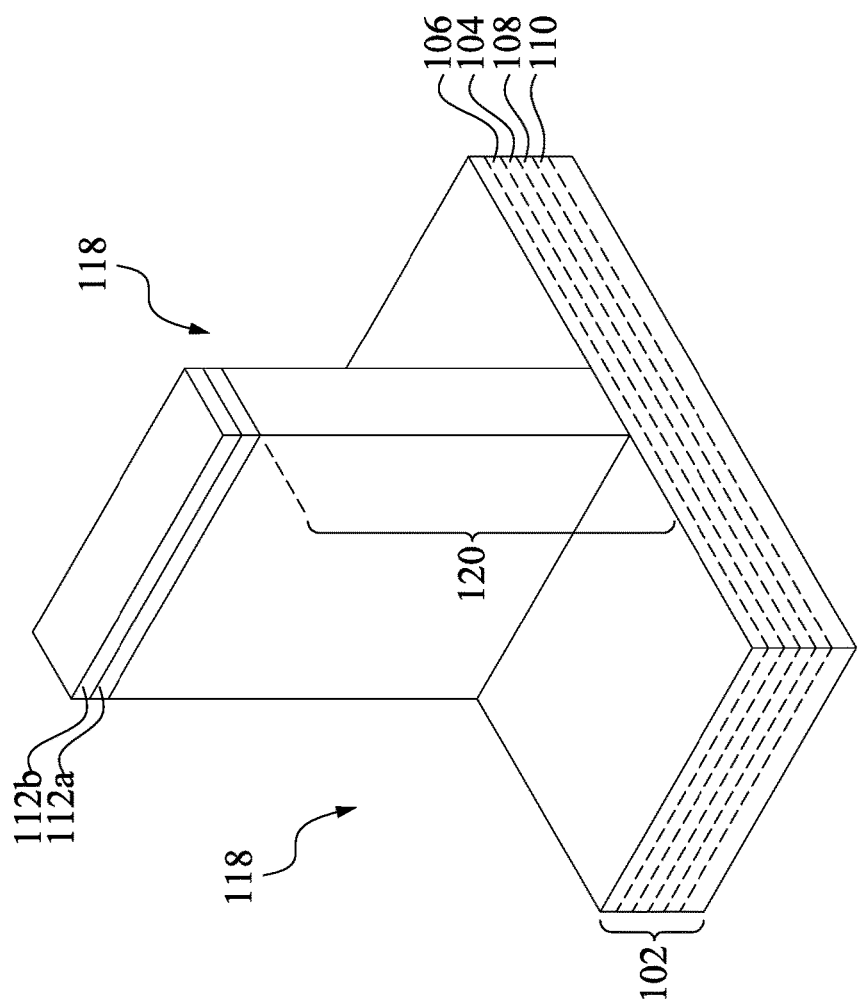

The mask layer 112b and the pad layer 112a are etched through the openings 116 to expose the underlying substrate 102. The exposed substrate 102 is then etched to form trenches 118 in the substrate 102 as illustrated in FIG. 2. Portions of the substrate 102 between the trenches 118 form strips 120. The trenches 118 may be strips (viewed from in the top of the semiconductor device 100) parallel to each other, and closely spaced with respect to each other. The photo-sensitive layer 114 is then removed. Next, a cleaning may be performed to remove a native oxide of the substrate 102. The cleaning may be performed using diluted hydrofluoric (DHF) acid.

Liner oxide (not shown) is then optionally formed in the trenches 118. In an embodiment, liner oxide may be a thermal oxide. In some embodiments, liner oxide may be formed using in-situ steam generation (ISSG) and the like. The formation of liner oxide rounds corners of the trenches 118, which reduces the electrical fields, and hence improves the performance of the resulting integrated circuit.

Figure 3:
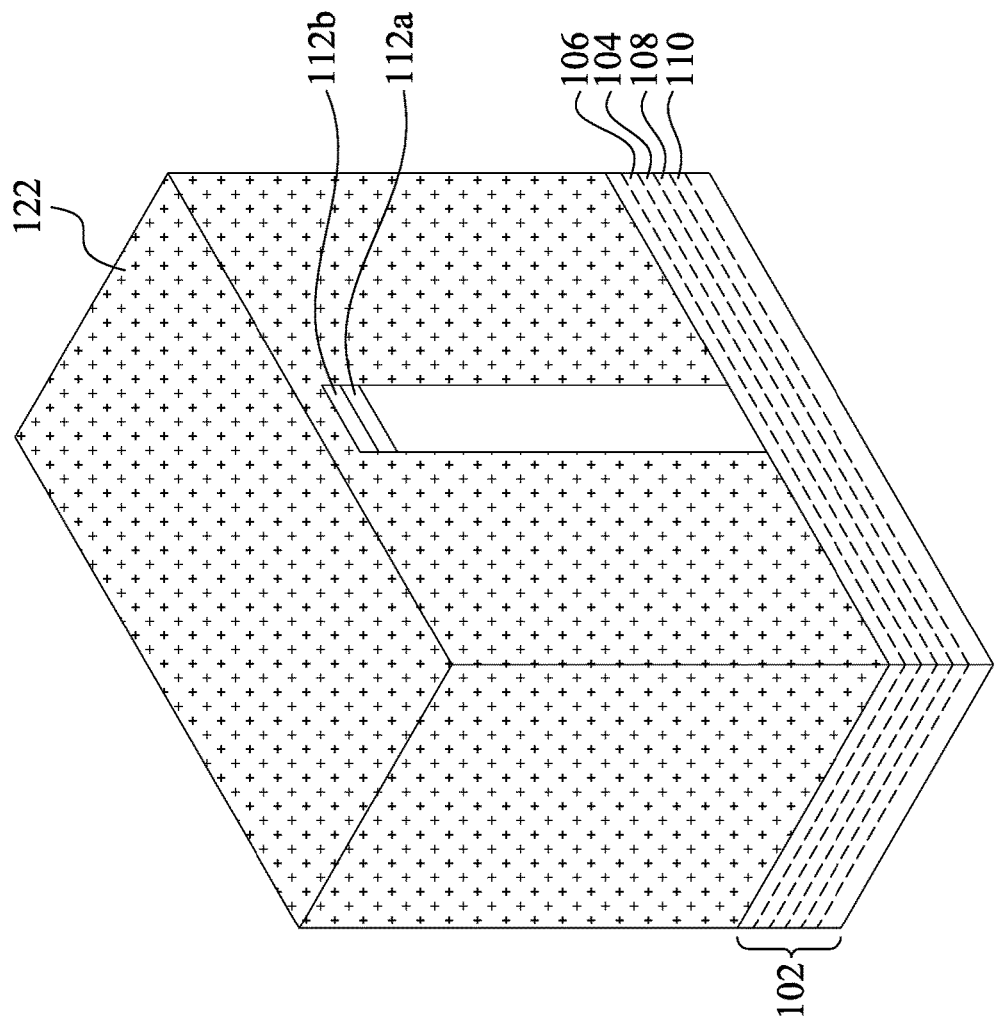

Referring now to FIG. 3, the trenches 118 are filled with a dielectric material 122. The dielectric material 122 may include silicon oxide, and hence is also referred to as oxide 122 in the present disclosure. In some embodiments, other dielectric materials, such as silicon nitride, silicon oxynitride, fluoride-doped silicate glass (FSG), or a low-K dielectric material, may also be used. In an embodiment, the oxide 122 may be formed using a high-density-plasma (HDP) CVD process, using silane ($SiH_4$) and oxygen ($O_2$) as reacting precursors. In other embodiments, the oxide 122 may be formed using a sub-atmospheric CVD (SACVD) process or high aspect-ratio process (HARP), wherein process gases may comprise tetraethylorthosilicate (TEOS) and/or ozone ($O_3$). In yet other embodiments, the oxide 122 may be formed using a spin-on-dielectric (SOD) process, such as hydrogen silsesquioxane (HSQ) or methyl silsesquioxane (MSQ).

Figure 4:
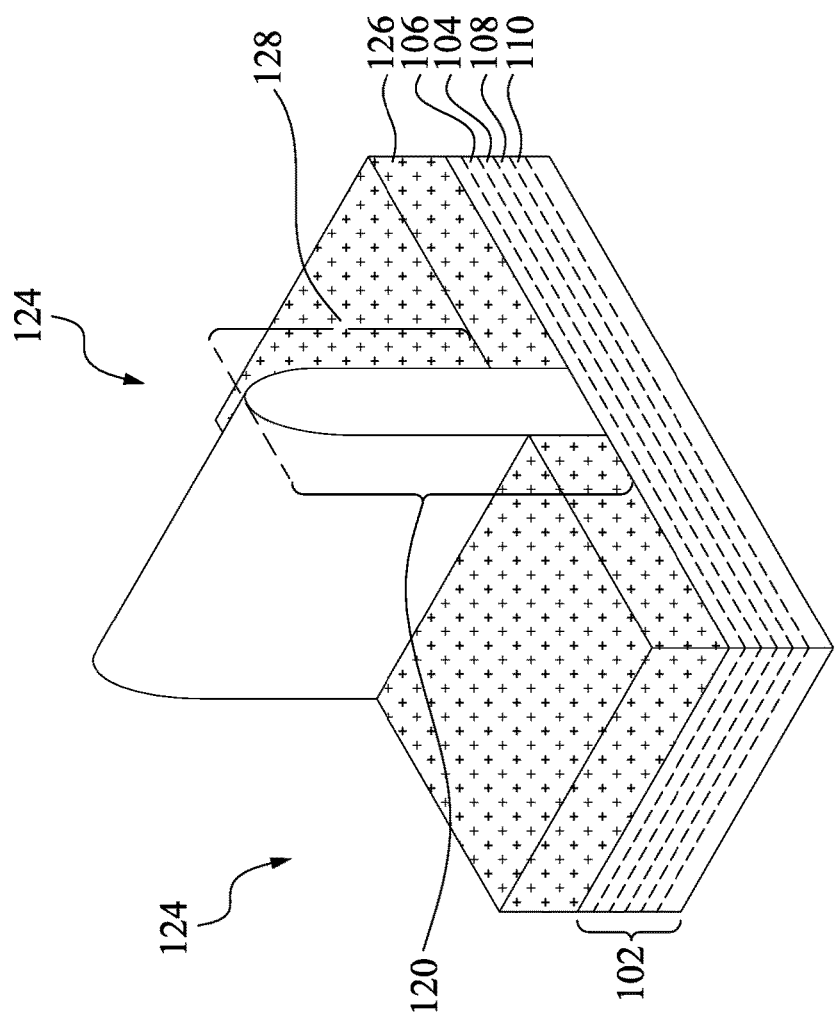

A chemical mechanical polish (CMP) is then performed, followed by the removal of the mask layer 112b and the pad layer 112a. The dielectric material 122 is recessed by an etching step, resulting in recesses 124. The remaining portions of the oxide 122 in the trenches 118 are hereinafter referred to as shallow trench insulation (STI) regions 126. The resulting structure is shown in FIG. 4. In one embodiment, the etching step may be performed using a wet etching process, for example, by dipping the substrate 102 in hydrofluoric acid (HF). In another embodiment, the etching step may be performed using a dry etching process, for example, the dry etching process may be performed using $CHF_3$ or $BF_3$ as etching gases. Throughout the description, a portion of the strips 120 higher than a top surface of the STI regions 126 is referred to as a fin (or protruding fin) 128.

Figure 5:
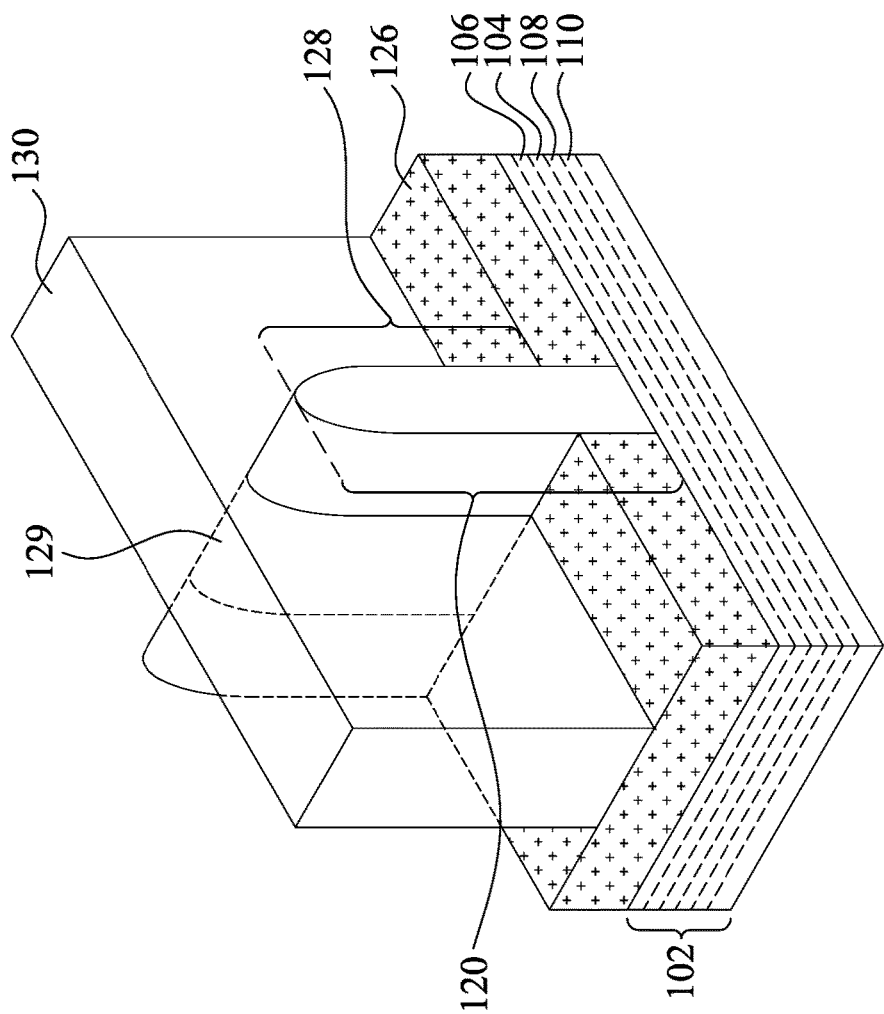

A dummy gate stack 130 is formed across the fin 128 and extends over the shallow trench insulation regions 126, as shown in FIG. 5. The dummy gate stack 130 includes sacrificial material and optionally one or more additional layers. The additional layers may include interfacial layers, etch stop layers, and/or dielectric layers. The sacrificial material may be poly silicon. It is noted that the fin 128 has a portion covered by and below the dummy gate stack 130 and is referred to as a channel portion 129 hereafter. The channel portion 129 cannot be seem from the perspective view of the semiconductor device 100 and is represented with dot lines in FIG. 5 to show its location in the semiconductor device 100.

Figure 6:
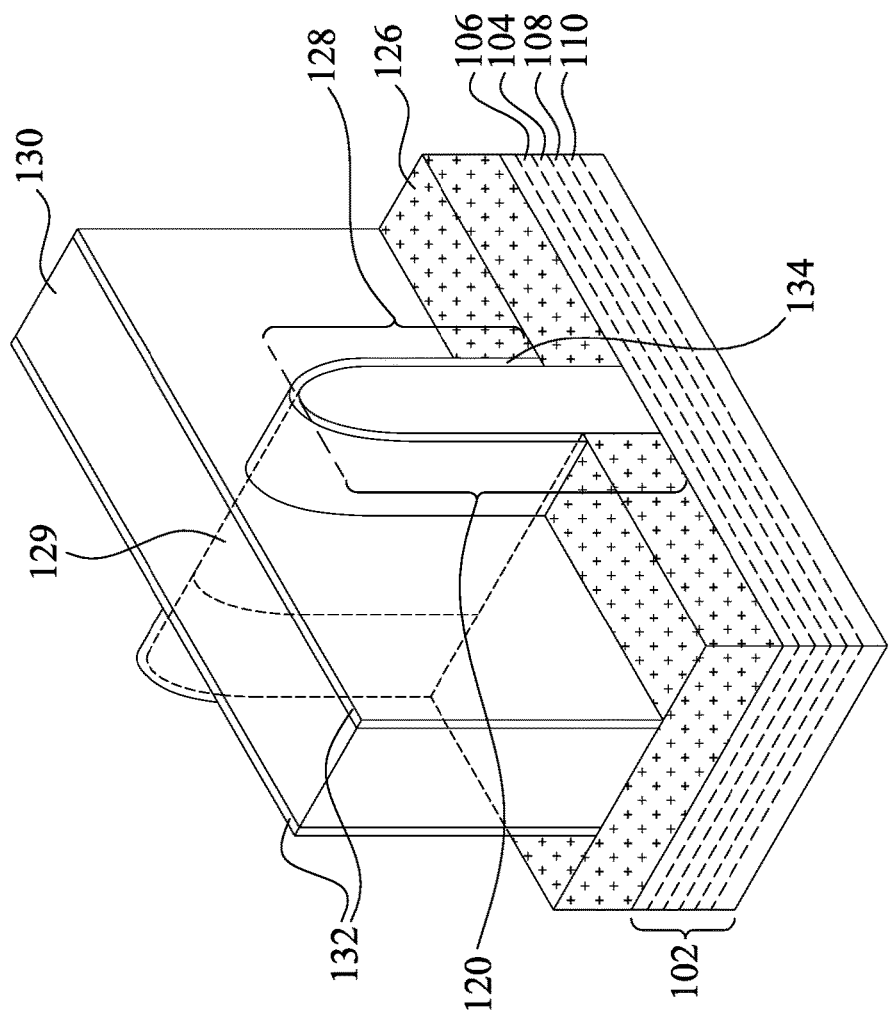

Next, referring to FIG. 6, after the dummy gate stack 130 is formed, gate spacers 132 are formed along opposing sidewalls of the dummy gate stack 130. A fin spacer layer 134 is formed around the fin 128. The gate spacers 132 and the fin spacer layer 134 may be formed by conformally depositing, such as by chemical vapor deposition (CVD), or the like, a spacer material and subsequently anisotropically etching the spacer material. In some embodiments, the spacer material is made of one or more layers of silicon nitride, silicon oxide, silicon oxynitride, silicon carbide, or other applicable dielectric materials.

Figure 7:
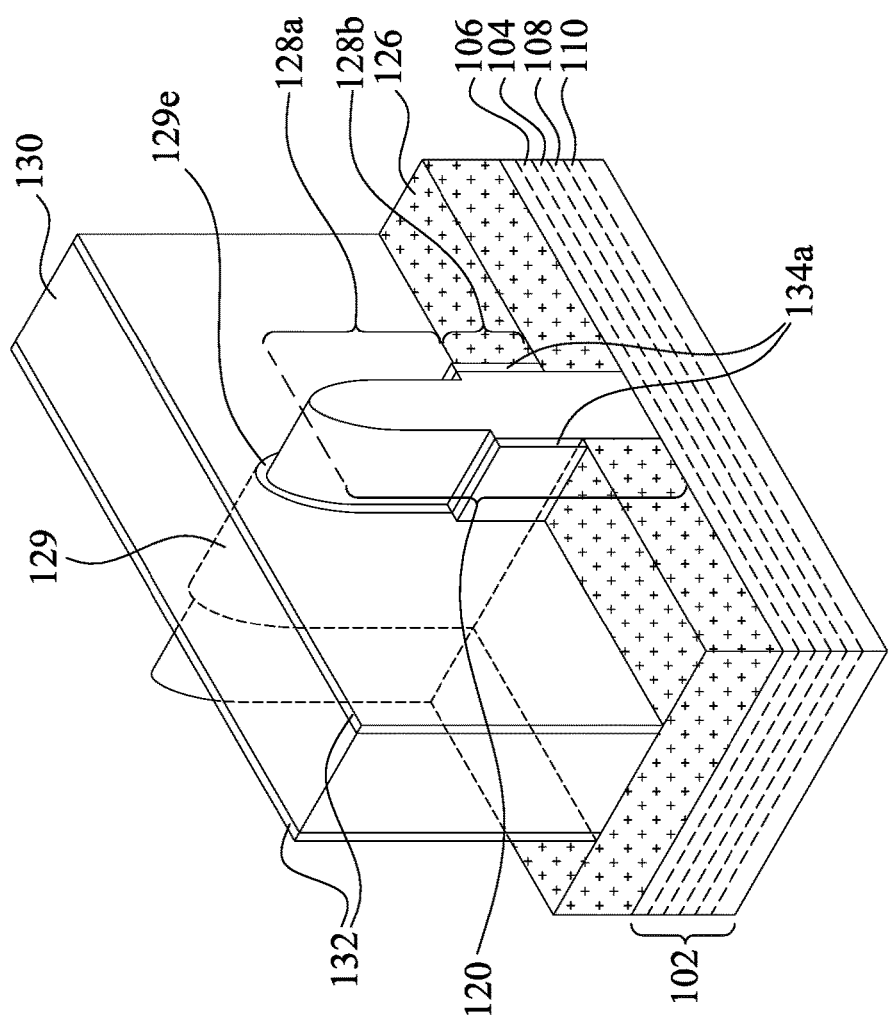

FIG. 7 illustrates the removal of a top portion of the fin spacer layer 134. For example, the top portion of the fin spacer layer 134 may be removed by a dry etch. As a result, an upper region 128a of the fin 128 is exposed. Portions of the fin spacer layer 134 left standing over and aligned to a lower portion 128b of the fin 128 are referred to as fin spacers 134a. The channel portion 129 has exposed edge regions 129e (e.g., exposed on outer sidewalls of the gate spacers 132). The fin spacers 134a have a height in a range from about 5 nm to about 15 nm in some embodiments. The fin spacers 134a can help controlling a size of the subsequently formed source/drain regions (see FIG. 10), which will be described in further detail below.

Figure 8:
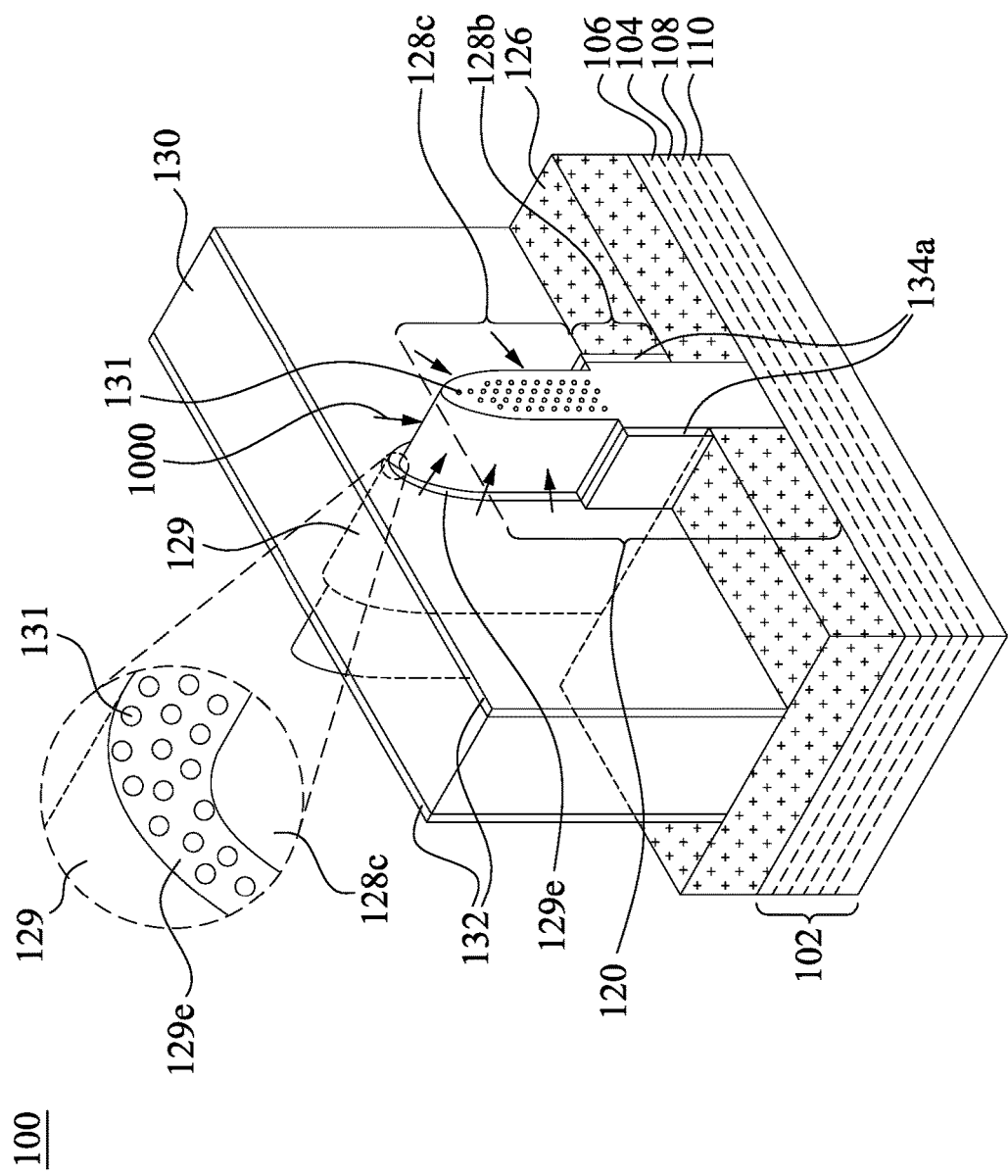

Next, as shown in FIG. 8, an anti-punch through doping process 1000 is performed on the upper region 128a of the fin 128 to form anti-punch-through (APT) regions 128c having dopants 131. The conductivity type of the dopants 131 doped in the APT regions 128c of the fin 128 is the same as that of the well region 104 and the APT region 106. Such configuration is beneficial for gate control over the channel portion 129. The APT region 128c can reduce the leakage from the source/drain regions (see FIG. 10) to the channel portion 129. Therefore, the $I_{on/off}$ device performance can be improved. The doping concentration of the dopants 131 in the APT region 128c may be in the range from about $1E13/cm^3$ to about $5E13/cm^3$. The dopant concentration in the channel portion 129 is lower than a dopant concentration in the APT region 128c. In some embodiments, the dopants 131 may diffuse in the channel portion 129 from the APT regions 128c. For example, the exposed edge regions 129e (e.g., exposed on outer sidewalls of the gate spacers 132)

may have dopants 131. The dopant concentration of the dopants 131 in the channel portion 129 is in a range from about 0 atoms/cm$^3$ to about 1E5 atoms/cm$^3$. The lower portion 128b of the fin 128 is substantially un-doped after performing the anti-punch through doping process 1000.

The APT regions 128c may be an n-type APT region or a p-type APT region. In some embodiments, the n-type APT region is obtained by doping with an n-type dopant, such as arsenic (As), phosphorous (P), or antimony (Sb). In some embodiments, the p-type APT region is obtained by doping with a p-type dopant, such as boron (B) or boron fluoride (BF$_2$).

In some embodiments, the anti-punch through doping process 1000 is an ion implantation (IMP) process, and the ions are implanted at an energy in a range from about 1 KeV to about 20 KeV. In some embodiments, the doping concentration is in a range from about 1E12 atoms/cm$^3$ to about 1E14 atoms/cm$^3$. In some embodiments, the temperature of the IMP process is in a range from about 20° C. to about 40° C.

In some other embodiments, the anti-punch through doping process is a plasma doping (PLAD) process. The plasma doping process may be performed using a doping gas. For example, the doping gas is a mixture of about 5 to about 10% of Xe with about 5 to about 10% of a carrier gas H$_2$. Post doping anneal is optional. Since the plasma ions in the plasma sheath could move in different directions, the PLAD process facilitates an improved uniformity of dopant concentration of the APT regions 128c. As a result, this structure induces an efficient strain to the replacement gate (see FIGS. 12A and 12B) to improve device performance, such as drain-induced barrier lowering (DIBL).

The doping gas is made by one or more dopant-containing gas. For example, if the dopant is p-type, one or more dopant containing gases, such as P, As, or a combination thereof, are used. The doping gas may also include a carrier gas, such as H$_2$, N$_2$, He, Ar, Ne, Kr, Xe. The percentage of the dopant-containing gas may be in a range from about 5% to about 10%. The RF (radio frequency) power is in a range from about 1 k watts (W) to about 10 kW and at a radio frequency in a range from about 0.1 kilohertz (KHz) to about 100 KHz, in accordance with some embodiments. The substrate may be or may not be biased. The dopant depth can be increased, if the substrate is biased. In some embodiments, the bias voltage is in a range from about 0.1 KV to about 10 KV. In some embodiments, the RF power supply can have dual frequencies. The doping plasma may be generated in the processing chamber or remotely (remote plasma). In some embodiments, the doping concentration in the APT region 128c is in a range from about 1E12 atoms/cm$^3$ to about 1E14 atoms/cm$^3$.

Figure 9:
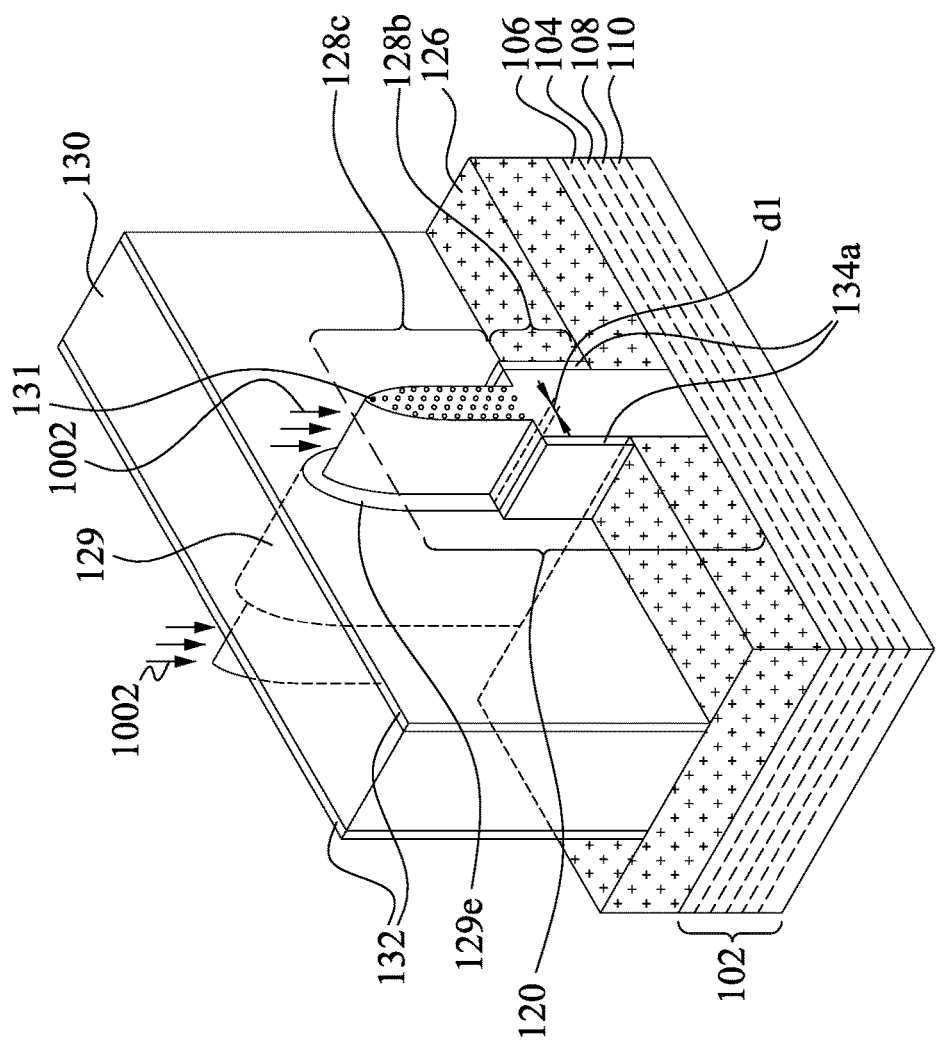

In some embodiments, the anti-punch through doping process 1000 may lead to undesired dopants 131 doped in the channel portion 129, which could decrease I$_{sat}$ (saturation current). A selective etching process 1002 may be performed after the anti-punch through doping process 1000 to remove the undesired dopants in the exposed edge regions 129e (e.g., exposed on outer sidewalls of the gate spacers 132) of the channel portion 129, as shown in FIG. 9. As a result, the APT regions 128c of the fin 128 are narrowed. The etching process 1002 is performed such that the APT regions 128c have a reduced lateral dimension. The APT regions 128c have a thickness variation dl, represented in a dot line, in a range from about 1 nm to about 3 nm. In some embodiments, the etching process 1002 is an etch-back process using hydrochloric acid (HCl) as an etchant or the like. In some embodiments, the etching process 1002 may be performed at a temperature in a range from 500° C. to about 700° C. and at a pressure from about 10 torr to about 50 torr.

Figure 10:
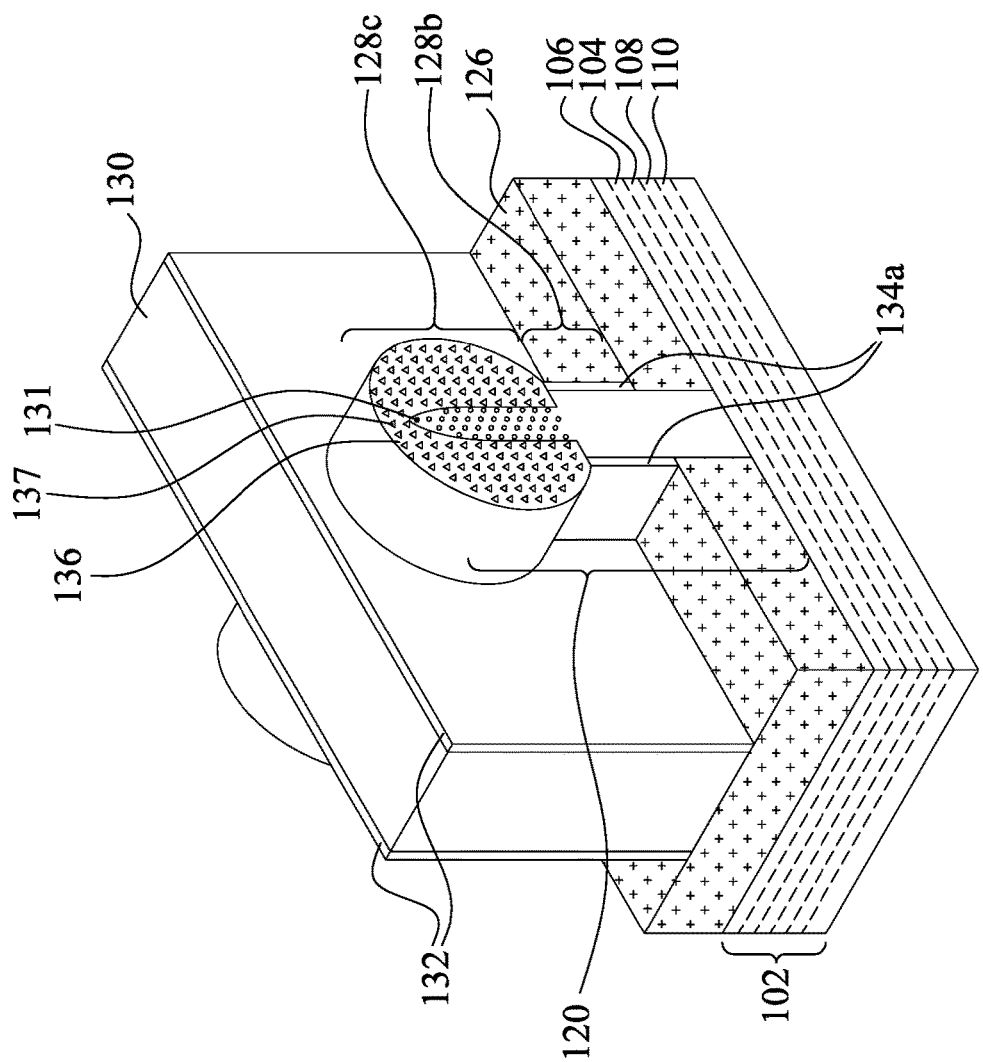

The structure depicted in FIG. 10 is produced by selectively growing an epitaxial layer 136 covering the APT regions 128c of the fin 128. Since the lattice constant of the epitaxial layer 136 is different from the lattice constant of the substrate 202, the channel portion 129 is strained or stressed to enable carrier mobility of the device and enhance device performance.

The epitaxy layer 136 is deposited, for example, epitaxially grown on the APT regions 128c by selective epitaxial growth (SEG) to form source/drain regions. The epitaxy layer 136 is formed around the APT regions 128c. This may be referred to as forming a "cladding" around the APT regions 128c. In various embodiments, the epitaxy layer 136 may include Ge, Si, GaAs, AlGaAs, SiGe, GaAsP, SiP, or other suitable material. The epitaxy layer 136 may be formed by one or more epitaxial (epi) processes. In some embodiments, the epitaxy layer 136 may be in-situ doped by dopants 137 during the epi process so that the epitaxy layer 136 becomes source/drain region of the semiconductor device 100. For example, in some embodiments, epitaxially grown SiGe epitaxy layer 136 may be doped with boron. In some embodiments, epitaxially grown Si epitaxy layer 136 may be doped with carbon to form Si:C source/drain features, phosphorous to form Si:P source/drain features, or both carbon and phosphorous to form SiCP epitaxy layer 136. In some embodiments where the epitaxy layer 136 is not in-situ doped, an implantation process is performed to dope the epitaxy layer 136.

If the height of the fin spacers 134a is greater than about 15 nm, the epitaxial layer 136 may not be grown. If the height of the fin spacer 134a is less than about 5 nm, the epitaxial layer 136 may merge with the epitaxy layer growing from neighboring fins (not shown).

Figure 11:
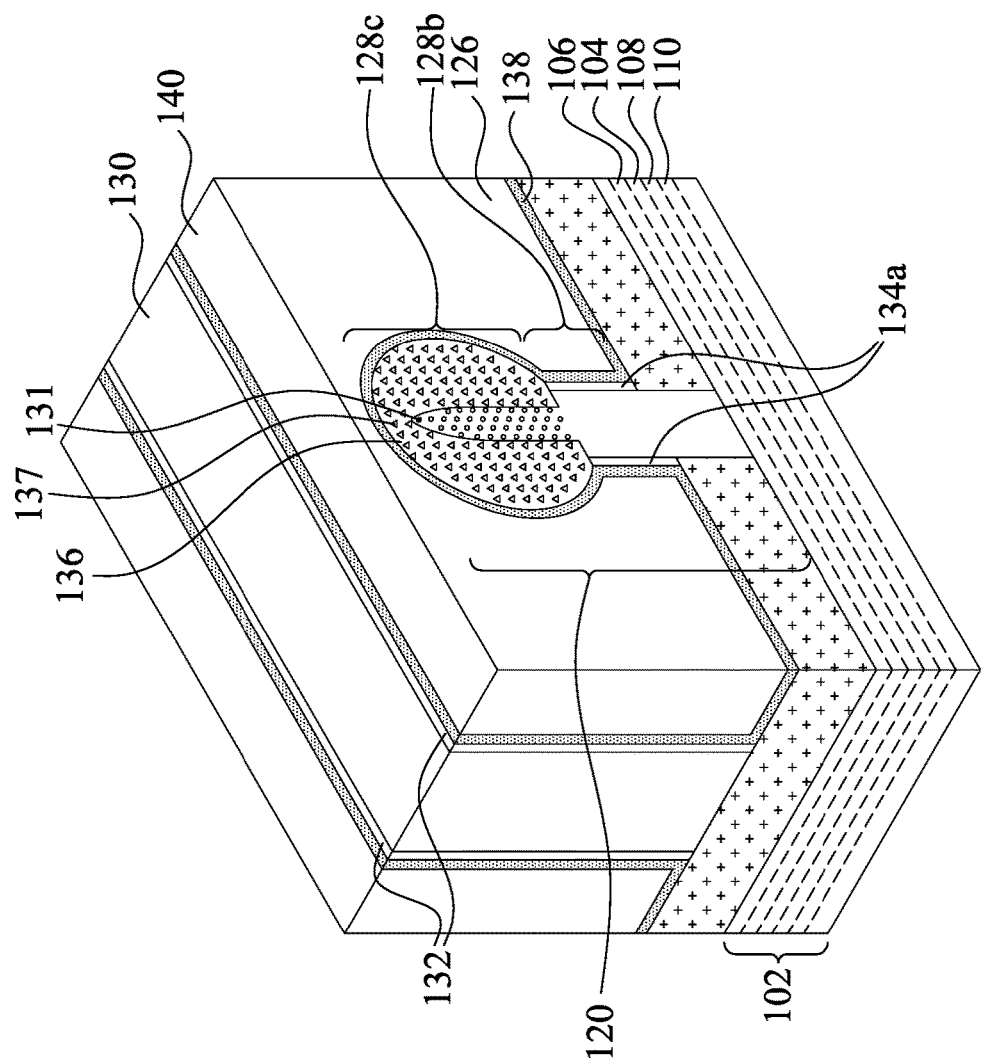

FIG. 11 illustrates a perspective view of the structure with a contact etch stop layer (CESL) 138 and an Inter-Layer Dielectric (ILD) 140 being formed. The CESL 138 may be formed of silicon nitride, silicon carbo-nitride, or the like. The CESL 138 may be formed using a conformal deposition method such as ALD (atomic layer deposition), for example. The ILD 140 may include a dielectric material formed using, for example, flowable chemical vapor deposition (FCVD), spin-on coating, CVD, or other deposition methods. ILD 140 may also be formed of Tetra Ethyl Ortho Silicate (TEOS) oxide, Plasma Enhanced CVD (PECVD) oxide (SiO$_2$), Phospho-Silicate Glass (PSG), Boro-Silicate Glass (BSG), Boron-Doped Phospho-Silicate Glass (BPSG), or the like. A planarization step such as CMP or mechanical grinding may be performed to level the top surfaces of the ILD 140, the dummy gate stack 130, and the gate spacers 132 with each other.

Figure 12A:
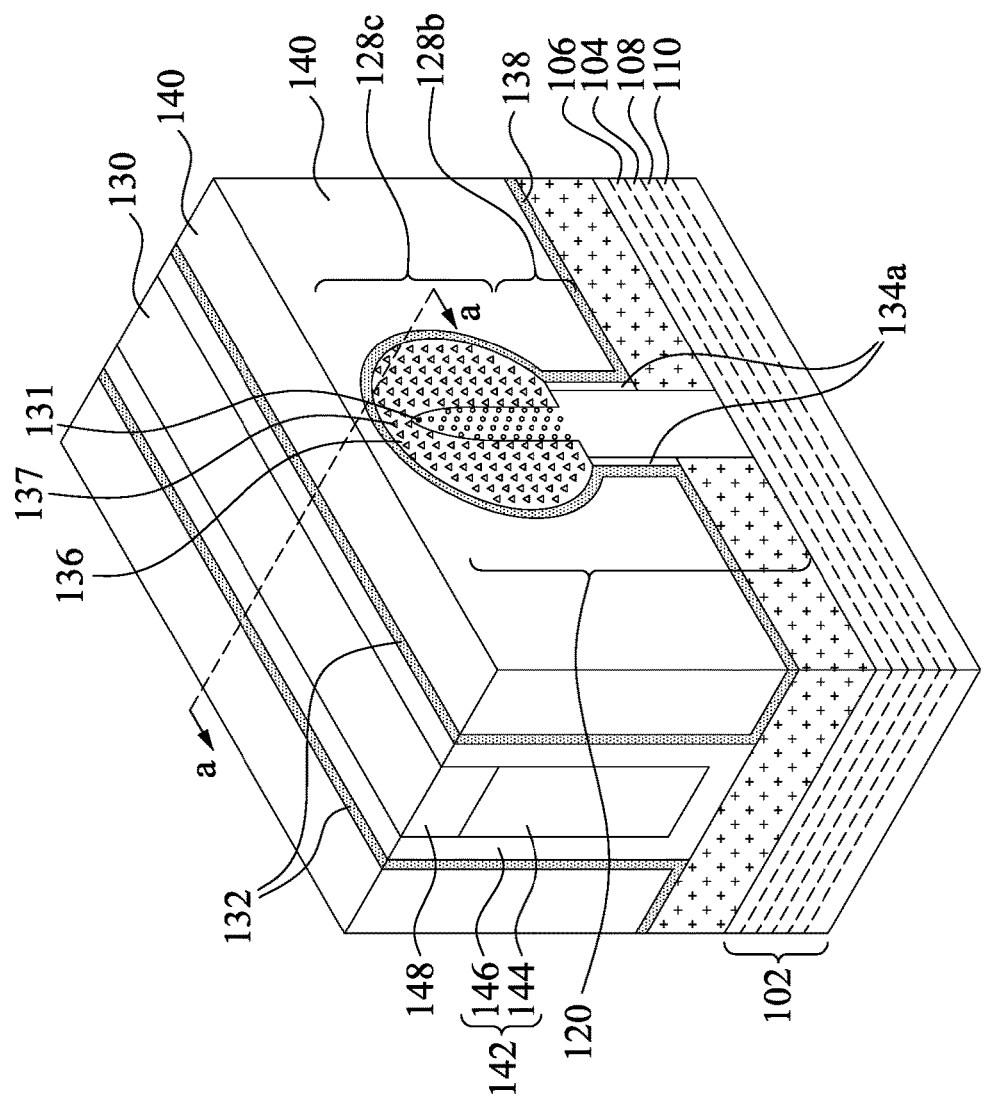
Figure 12B:
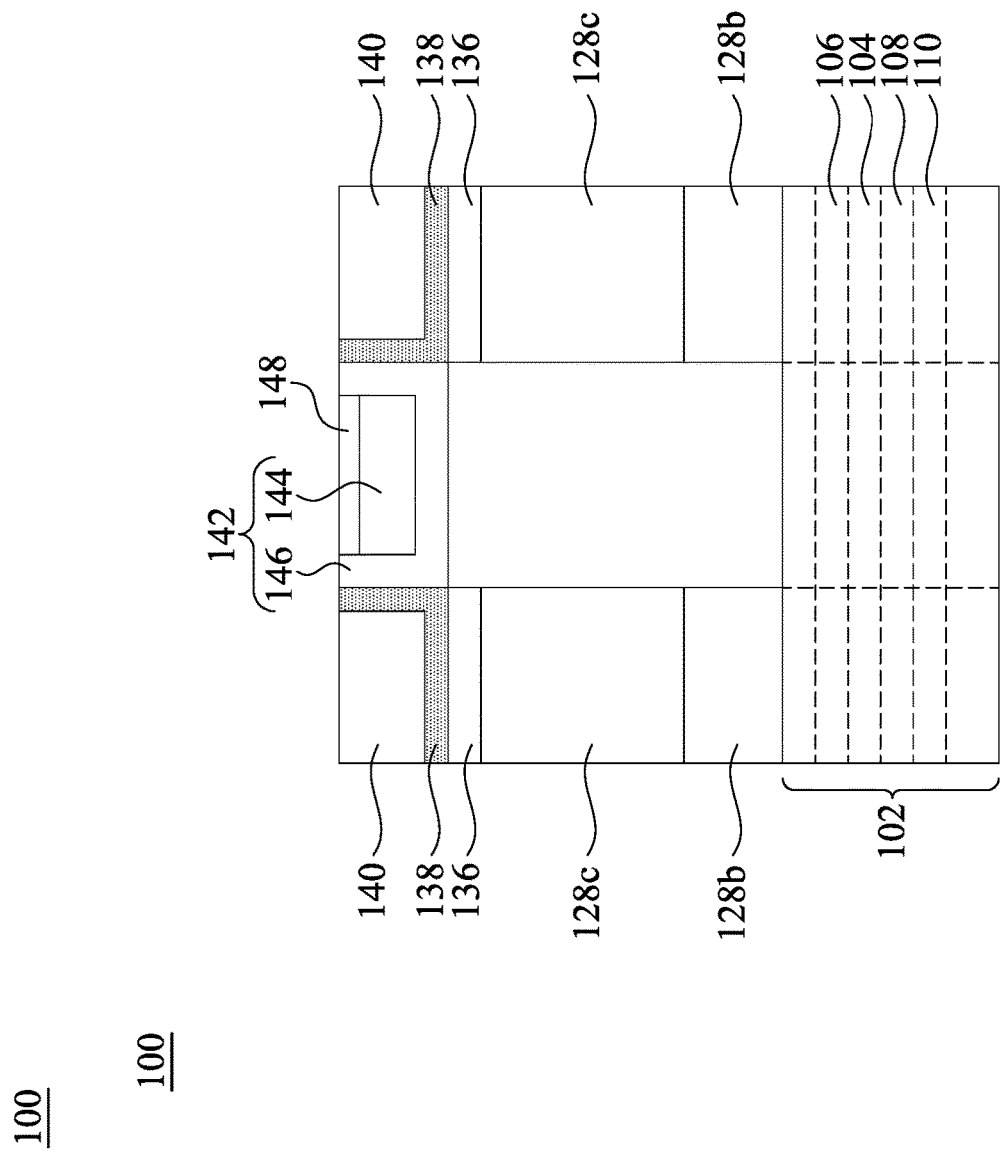
FIG. 12B illustrates a cross-sectional view of the FinFET taken along a line a-a of FIG. 12A.

Next, the dummy gate stack 130 is replaced with a replacement gate stack 142, which include a gate electrode 144 and a gate dielectric layer 146 as shown in FIGS. 12A and 12B. When replacing the dummy gate stack 130, the dummy gate stack 130 is first removed in one or a plurality of etching steps, resulting in a trench (opening) to be formed between the gate spacers 132. In the formation of the replacement gate stack 142, the gate dielectric layer 146 is first formed, which extends into the trench left by the removed dummy gate stack, and may have a portion extending over the ILD 140. In accordance with some embodiments of the present disclosure, the gate dielectric layer 146 includes an interfacial layer (IL, not shown separately) as its lower part. The IL may include an oxide layer such as a silicon oxide layer, which is formed through a chemical oxidation process or a deposition process. The gate dielectric layer 146 may also include a high-k dielectric layer formed over the IL. The high-k dielectric layer is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer in gate dielectric layer 146 is formed using ALD or CVD.

The gate electrode 144 is formed over the gate dielectric layer 146 and filling the remaining portion of the trench. The formation of the gate electrode 144 may include a plurality of deposition processes to deposit a plurality of conductive layers, and performing a planarization step to remove the excess portions of the conductive layers over the ILD 140. The deposition of the conductive layers may be performed using conformal deposition methods such as ALD or CVD.

The gate electrode 144 may include a diffusion barrier layer and one (or more) work-function layer over the diffusion barrier layer. The diffusion barrier layer may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET. For example, for the n-type FinFET in device regions, the work-function layer may include a TaN layer and a titanium aluminum (TiAl) layer over the TaN layer. For the p-type FinFET, the work-function layer may include a TaN layer, a TiN layer over the TaN layer, and a TiAl layer over the TiN layer. After the deposition of the work-function layer(s), another barrier layer, which may be another TiN layer, is formed. The gate electrode 144 may also include a filling metal, which may be formed of tungsten or cobalt, for example. After the formation of the replacement gate stack 142, the replacement gate stack 142 is etched back, and a dielectric hard mask 148 is formed over the etched-back replacement gate 142.

In some embodiments, the semiconductor device 100 includes other layers or features not specifically illustrated. In some embodiments, other back end of line (BEOL) processes are performed on the semiconductor device 100. In some embodiments, the semiconductor device 100 is formed by a non-replacement metal gate process or a gate-first process.

Based on the above discussions, it can be seen that the present disclosure offers advantages. It is understood, however, that other embodiments may offer additional advantages, and not all advantageous are necessarily disclosed herein, and that no particular advantage is required for all embodiments. One advantage is that the leakage from the source/drain regions to the channel portion can be reduced due to the APT region of the S/D portion in the fin. Therefore, the $I_{on/off}$ device performance can be improved.

According to some embodiments, a method of forming a semiconductor device includes following steps. A semiconductor strip is formed extending above a semiconductor substrate. A shallow trench isolation (STI) region is formed over the semiconductor substrate. The semiconductor strip has a fin structure higher than a top surface of the STI region. The fin structure includes a channel portion and a source/drain (S/D) portion adjacent to the channel portion. A dummy gate stack is formed over the channel portion. The S/D portion is exposed by the dummy gate stack. A doping process is performed to a top of the S/D portion using first dopants. An epitaxy layer is formed around the top of the S/D portion. The epitaxy layer has second dopants. A conductivity type of the second dopants is different from a conductivity type of the first dopants. The dummy gate stack is replaced with a replacement gate stack.

According to some embodiments, a method of forming a semiconductor device includes following steps. A first anti-punch through (APT) region is formed in a substrate. The substrate is etched to form at least one strip. A shallow trench isolation region is formed over the substrate. The strip includes a fin structure protruding from the shallow trench isolation region. The fin structure has a channel region and S/D regions. The S/D regions are on opposing sides of the channel region. A second anti-punch through (APT) region is formed in at least one of the S/D region of the fin structure by a doping process. A metal gate is formed over the channel region of the fin structure.

According to some embodiments, a semiconductor device includes a strip, a shallow trench isolation (STI) region, a gate stack and an epitaxy layer. The strip extends above a substrate. The STI region is over the substrate. The strip has a fin structure higher than a top surface of the STI region, the fin structure includes a channel portion and a source/drain (S/D) portion adjacent to the channel portion, and the S/D portion has a top having first dopants. The gate stack covers the channel portion. The epitaxy layer covers the top of the S/D portion. The epitaxy layer has second dopants. The second dopants have a conductivity type different from a conductivity type of the first dopants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming a semiconductor strip extending above a semiconductor substrate;

forming a shallow trench isolation (STI) region over the semiconductor substrate, wherein the semiconductor strip has a fin structure higher than a top surface of the STI region, and the fin structure comprises a channel portion and a source/drain (S/D) portion adjacent to the channel portion;

forming a dummy gate stack over the channel portion, wherein the S/D portion is exposed by the dummy gate stack;

performing a doping process to an upper portion of the S/D portion using first dopants of a first conductivity type;

forming an epitaxy layer around the upper portion of the S/D portion, wherein the epitaxy layer has second dopants of a second conductivity type opposite the first conductivity type; and replacing the dummy gate stack with a replacement gate stack.

2. The method of claim 1, further comprising:
forming fin spacers along opposing sidewalls of a lower portion of the S/D portion before performing the doping process.

3. The method of claim 2, wherein forming the fin spacers further comprises:
forming a fin spacer layer around the S/D portion; and
removing an upper portion of the fin spacer layer to expose the upper portion of the S/D portion.

4. The method of claim 1, wherein a lower portion of the S/D portion is substantially un-doped by the doping process.

5. The method of claim 1, wherein the doping process is performed using an ion implantation (IMP) process.

6. The method of claim 1, wherein the doping process is performed using a plasma doping process.

7. The method of claim 1, further comprising:
thinning the upper portion of the S/D portion after performing the doping process.

8. The method of claim 1, wherein the doping process is performed such that some of the first dopants diffuse into the channel portion.

9. The method of claim 8, further comprising:
performing an etching process to the S/D portion after performing the doping process.

10. The method of claim 9, wherein the etching process is performed such that the some of the first dopants in the channel portion are partially removed.

11. The method of claim 9, wherein the etching process is performed such that the upper portion of the S/D portion has a reduced lateral dimension.

12. The method of claim 9, wherein the etching process is performed using HCl as an etchant.

13. A method of forming a semiconductor device, comprising:
forming a first anti-punch through (APT) region in a substrate;
etching the substrate to form at least one strip;
forming a shallow trench isolation (STI) region over the substrate, wherein the strip comprises a fin structure protruding from the STI region, the fin structure has a channel region and source/drain (S/D) regions on opposing sides of the channel region;
forming a second anti-punch through (APT) region in at least one of the S/D regions of the fin structure by a doping process;
forming an epitaxial layer cladding the second APT region in the at least one of the S/D regions after forming the second APT region; and
forming a metal gate over the channel region of the fin structure.

14. The method of claim 13, wherein the first APT region and the second APT region have the same conductivity type.

15. The method of claim 13, further comprising:
forming a well region in the substrate, wherein the well region has a conductivity type same as a conductivity type of the second APT region.

16. The method of claim 13, further comprising:
narrowing the second APT region before forming the metal gate.

17. A method of forming a semiconductor device, comprising:
etching a semiconductor substrate to form a strip;
forming a shallow trench insulation (STI) region on the semiconductor substrate and adjoining a lower portion of the strip;
forming a dummy gate stack across an upper portion of the strip;
forming gate spacers on opposing sidewalls of the dummy gate stack;
performing an anti-punch through doping process on the upper portion of the strip;
performing an etch-back process to the upper portion of the strip;
after the etch-back process, forming source/drain features around the upper portion of the strip; and
replacing the dummy gate stack with a replacement gate stack.

18. The method of claim 17, wherein the etch-back process is performed using hydrochloric acid (HCl) as an etchant.

19. The method of claim 17, wherein after performing the anti-punch through doping process, the upper portion of the strip has a doping concentration in a range from about $1E13/cm^3$ to about $5E13/cm^3$.

20. The method of claim 13, wherein the second APT region and the epitaxial layer have different conductivity types.

* * * * *